(12) United States Patent
Mihajlovic et al.

(10) Patent No.: US 10,211,393 B2
(45) Date of Patent: Feb. 19, 2019

(54) SPIN ACCUMULATION TORQUE MRAM

(71) Applicant: SANDISK TECHNOLOGIES LLC, Plano, TX (US)

(72) Inventors: Goran Mihajlovic, San Jose, CA (US); Neil Smith, San Jose, CA (US); Jordan Asher Katine, Mountain View, CA (US); Neil Leslie Robertson, Palo Alto, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/440,129

(22) Filed: Feb. 23, 2017

(65) Prior Publication Data
US 2018/0240966 A1    Aug. 23, 2018

(51) Int. Cl.
| H01L 43/08 | (2006.01) |
| H01L 43/02 | (2006.01) |
| H01L 43/10 | (2006.01) |
| H01L 27/22 | (2006.01) |
| G11C 11/16 | (2006.01) |
| G11C 11/18 | (2006.01) |

(52) U.S. Cl.
CPC .............. *H01L 43/08* (2013.01); *G11C 11/16* (2013.01); *G11C 11/161* (2013.01); *G11C 11/165* (2013.01); *G11C 11/1673* (2013.01); *G11C 11/1675* (2013.01); *G11C 11/18* (2013.01); *H01L 27/228* (2013.01); *H01L 43/02* (2013.01); *H01L 43/10* (2013.01)

(58) Field of Classification Search
CPC ..... H01L 27/222; H01L 27/228; H01L 43/08; H01L 43/10; G11C 11/16; G11C 11/161

USPC ................................... 257/421, 427
See application file for complete search history.

(56) References Cited

U.S. PATENT DOCUMENTS

| 7,149,106 | B2 | 12/2006 | Mancoff | |
| 2001/0035545 | A1 | 11/2001 | Schuster-Woldan | |
| 2002/0008989 | A1 | 1/2002 | Honigschmid | |
| 2006/0022220 | A1* | 2/2006 | Inomata | B82Y 10/00 257/214 |
| 2008/0258247 | A1 | 10/2008 | Mancoff | |
| 2011/0244268 | A1* | 10/2011 | Sasaki | G01R 33/1284 428/812 |
| 2012/0133007 | A1* | 5/2012 | Kimura | G11C 11/16 257/421 |
| 2012/0313191 | A1 | 12/2012 | Whig | |

(Continued)

OTHER PUBLICATIONS

Makarov, et al., "SOT-MRAM based on 1 Transistor-1MTJ-Cell Structure," 2015 15th Non-Volatile Memory Technology Symposium (NVMTS 2015) Oct. 12-14, 2015, Beijing, China.

(Continued)

*Primary Examiner* — Matthew E Warren
(74) *Attorney, Agent, or Firm* — Vierra Magen Marcus LLP

(57) ABSTRACT

An MRAM memory cell is proposed that is based on spin accumulation torque. One embodiment includes a magnetic tunnel junction, a spin accumulation layer connected to the magnetic tunnel junction and a polarization layer connected to the spin accumulation layer. The polarization layer and the spin accumulation layer use spin accumulation to provide a spin accumulation torque on the free magnetic layer of the magnetic tunnel junction to change direction of magnetization of the free magnetic layer.

18 Claims, 12 Drawing Sheets

(56) References Cited

U.S. PATENT DOCUMENTS

| | | |
|---|---|---|
| 2014/0056061 A1 | 2/2014 | Khvalkovskiy |
| 2014/0204487 A1* | 7/2014 | Hase ................. H01L 43/08 360/244 |
| 2014/0264511 A1 | 9/2014 | De Brosse |
| 2015/0097159 A1* | 4/2015 | Apalkov ............. H01L 43/08 257/31 |
| 2016/0276576 A1 | 9/2016 | Xia |

OTHER PUBLICATIONS

Sbiaa, et al., "Materials with perpendicular magnetic anisotropy for magnetic random access memory," Phys. Status Solidi RRL 5, No. 12, 413-419. DOI:10.1002/pssr.201105420, Oct. 2011.

PCT International Search Report dated Feb. 9, 2018, PCT Patent Application No. PCT/US2017/063394.

Fan, et al., "STT-SNN: A Spin-Transfer-Torque Based Soft-Limiting Non-Linear Neuron for Low-Power Artificial Neural Netowrks," IEEE Transactions on Nanotechnology, IEEE Service Center, Piscathaway, NJ, US, vol. 14, No. 6, Nov. 1, 2015.

\* cited by examiner

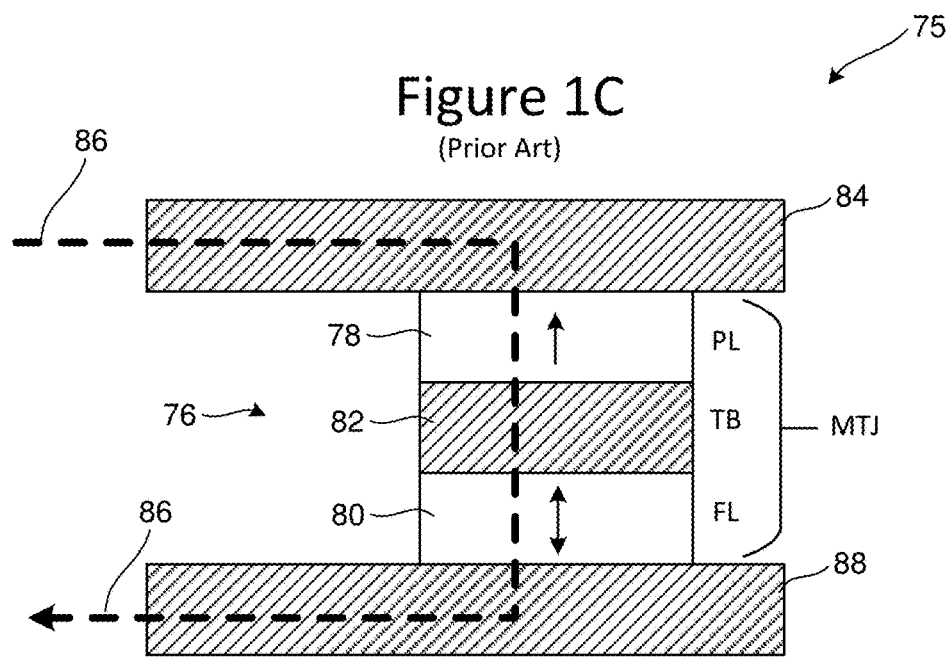
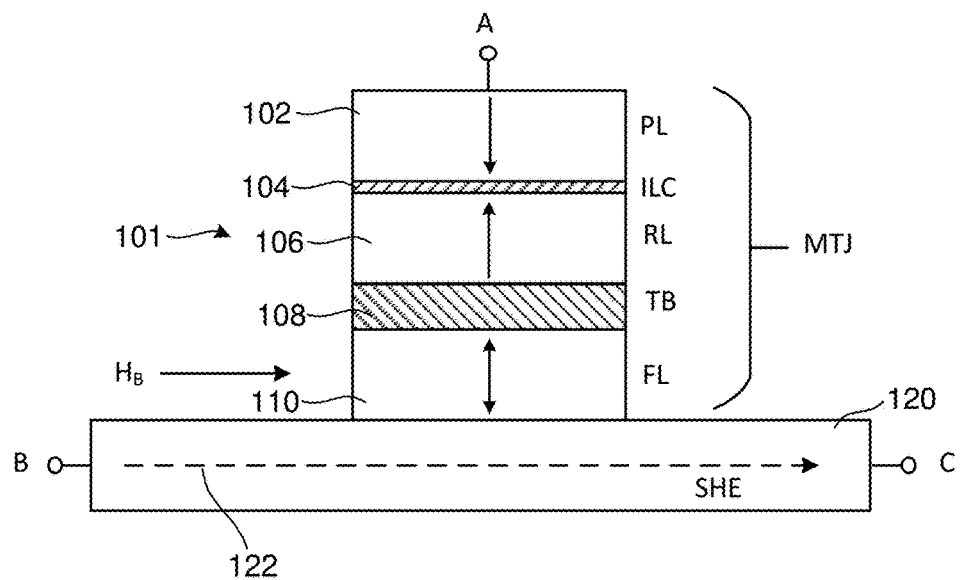

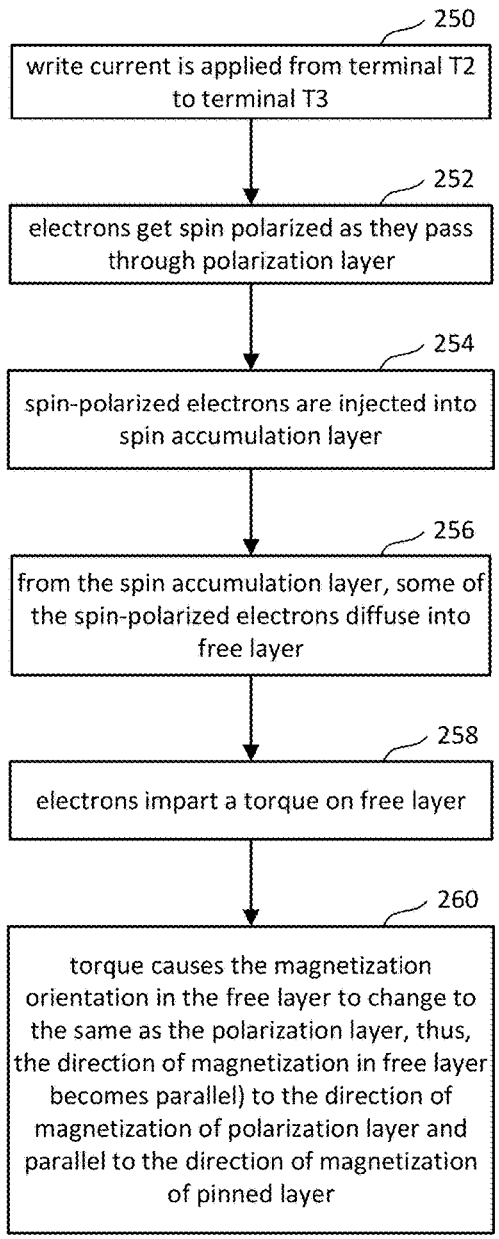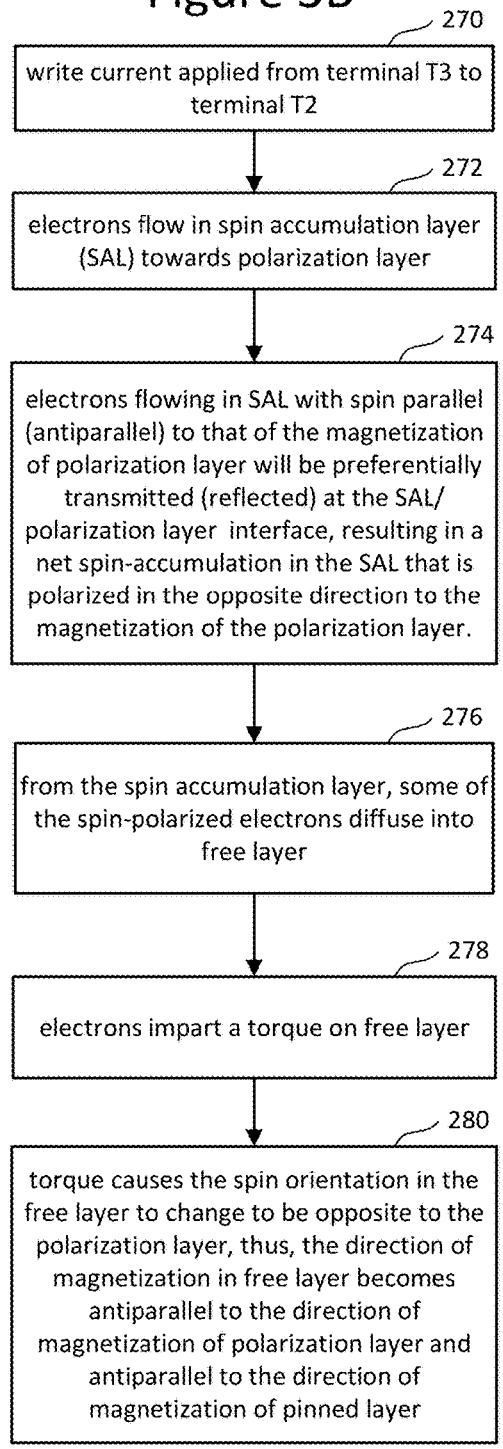

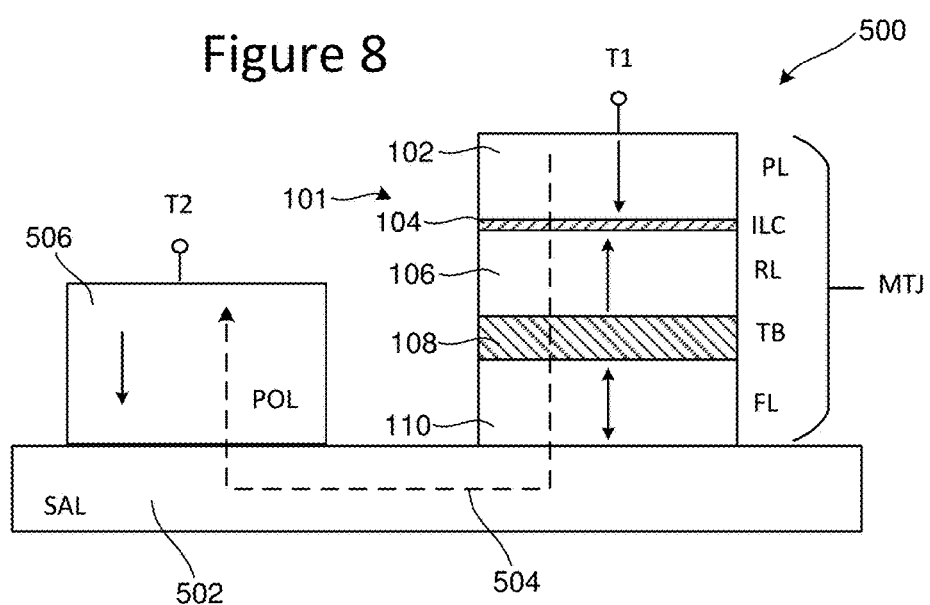

SPIN ACCUMULATION TORQUE MRAM

BACKGROUND

Memory is widely used in various electronic devices such as cellular telephones, digital cameras, personal digital assistants, medical electronics, mobile computing devices, non-mobile computing devices and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to other memory technologies that use electronic charges to store data. Generally, MRAM includes a large number of magnetic memory cells formed on a semiconductor substrate, where each memory cell represents one data bit. A bit of data is written to a memory cell by changing the magnetization direction of a magnetic element within the memory cell, and a bit is read by measuring the resistance of the memory cell (low resistance typically represents a "0" bit and high resistance typically represents a "1" bit).

Although MRAM is a promising technology, previous MRAM memory cells were overly complicated to manufacture, operated inefficiently and/or did not switch deterministically.

BRIEF DESCRIPTION OF THE DRAWINGS

Like-numbered elements refer to common components in the different figures.

FIG. 1C is a block diagram of a MRAM memory cell.
FIG. 1D is a block diagram of a MRAM memory cell.
FIG. 3A is a flow chart describing one embodiment of a process for writing to a MRAM memory cell.
FIG. 3B is a flow chart describing one embodiment of a process for writing to a MRAM memory cell.
FIG. 8 is a block diagram of a MRAM memory cell.

DETAILED DESCRIPTION

Figure 1A:
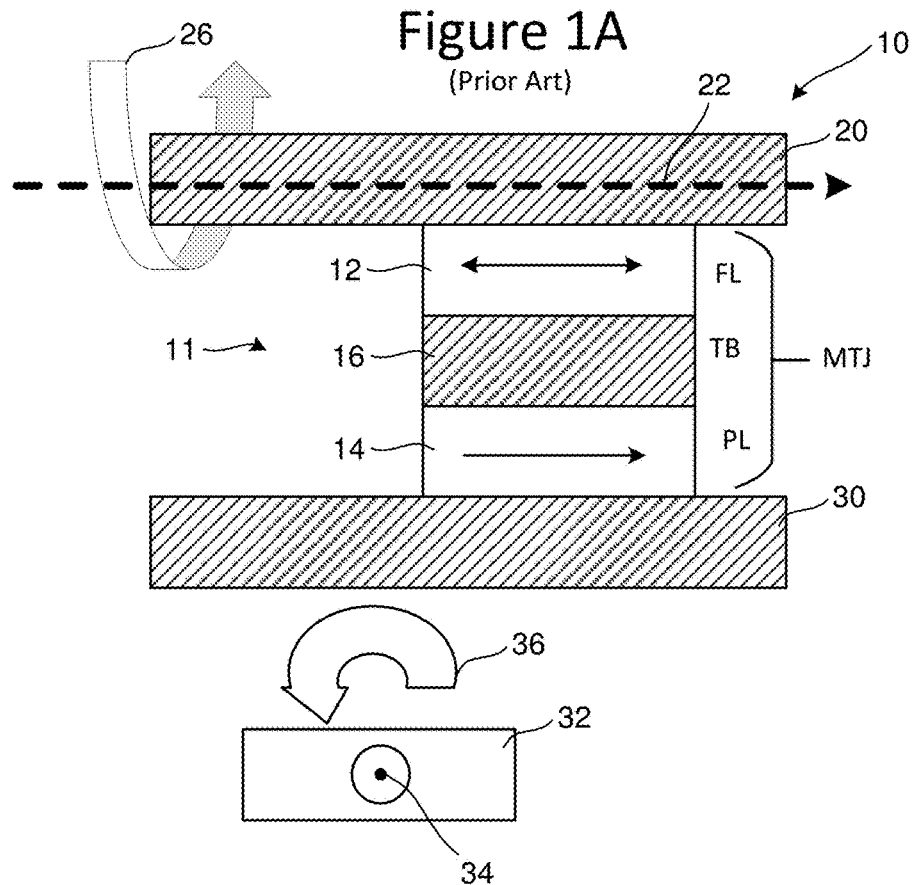
FIG. 1A is a block diagram of a MRAM memory cell.

FIG. 1A is a schematic perspective view of a prior MRAM memory cell 10 that makes use of field induced switching. Generally, a MRAM cell 10 includes a magnetic tunnel junction (MTJ) 11 comprising an upper ferromagnetic layer 12, a lower ferromagnetic layer 14, and a tunnel barrier (TB) 16 which is an insulating layer between the two ferromagnetic layers. In this example, upper ferromagnetic layer 12 is a free layer FL and the direction of its magnetization can be switched. Lower ferromagnetic layer 14 is a pinned (or fixed) layer PL and the direction of its magnetization does not change.

When the magnetization in free layer FL 12 is parallel to the magnetization in pinned layer PL 14, the resistance across the memory cell is relatively low due, at least in part, to spin dependent scattering of the minority electrons. When the magnetization in free layer FL 12 is anti-parallel to the magnetization in pinned layer PL 14, the resistance across memory cell 10 is relatively high due, at least in part, to spin dependent scattering of minority and majority electrons. The data ("0" or "1") in memory cell 10 is read by measuring the resistance of the memory cell 10. In this regard, electrical conductors 20/30 attached to memory cell 10 are utilized to read the MRAM data.

The direction of the magnetization in free layer 12 changes in response to current 34 flowing in a digit line 32 and in response to current 22 flowing in a write line 20 that generate magnetic fields 36 and 26 respectively. FIG. 1A depicts the situation where the current 34 in digit line 32 is flowing out of the page and the current 22 in write line 20 is flowing from left to right resulting in two fields that are orthogonal, which will cause the magnetization in free layer 12 to switch from parallel to anti-parallel relative to the magnetization in fixed layer 14. In a typical MRAM, the orientation of a bit is switched by reversing the polarity of the current 22 in the write line 20 while keeping a constant polarity of the current 34 in the digit line 32.

The field induced switching technique described above for the memory cell of FIG. 1A has some practical limitations, particularly when the design calls for scaling the memory cell to smaller dimensions. For example, since this technique requires two sets of magnetic field write lines, the array of MRAM cells is susceptible to bit disturbs (i.e., neighboring cells may be unintentionally altered in response to the write current directed to a given cell). Furthermore, decreasing the physical size of the MRAM memory cells results in lower magnetic stability against magnetization switching due to thermal fluctuations. The stability of the bit can be enhanced by utilizing a magnetic material for the free layer with a large magnetic anisotropy and therefore a large switching field, but then the currents required to generate a magnetic field strong enough to switch the bit are impractical in existing applications.

Figure 1B:
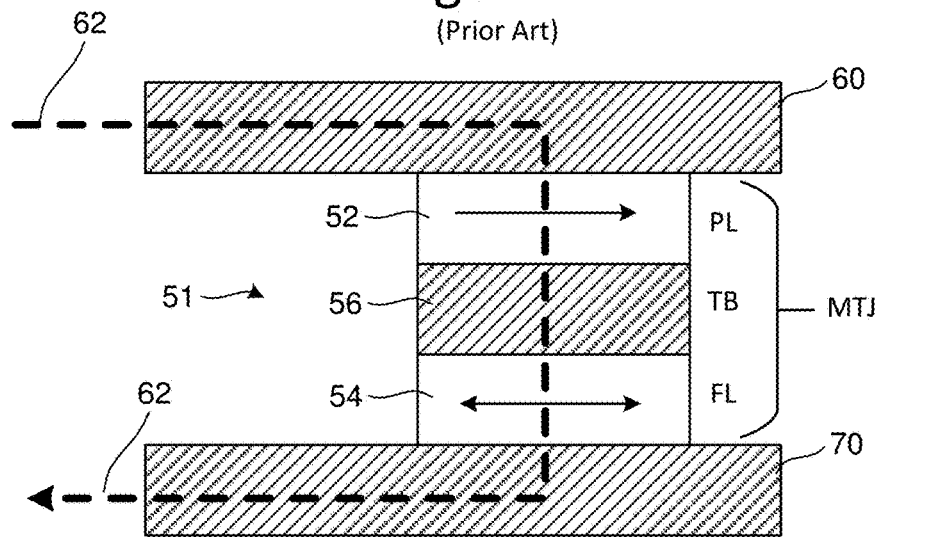
FIG. 1B is a block diagram of a MRAM memory cell.

Spin-transfer-torque (STT) switching is another technique for programming MRAM memory cells. FIG. 1B is a schematic representation of an STT-switching technique for an MRAM cell 50 that includes a magnetic tunnel junction (MTJ) 51 comprising an upper ferromagnetic layer 52, a lower ferromagnetic layer 54, and a tunnel barrier (TB) 56 which is an insulating layer between the two ferromagnetic layers. In this example, lower ferromagnetic layer 54 is the free layer FL and the direction of its magnetization can be switched. Upper ferromagnetic layer 52 is the pinned (or fixed) layer PL and the direction of its magnetization is not easily changed. When the magnetization in free layer 54 is parallel to the magnetization in pinned layer PL 52, the resistance across the memory cell 50 is relatively low. When the magnetization in free layer FL 54 is anti-parallel to the magnetization in pinned layer PL 52, the resistance across memory cell 50 is relatively high. The data ("0" or "1") in memory cell 50 is read by measuring the resistance of the memory cell 50. In this regard, electrical conductors 60/70 attached to memory cell 50 are utilized to read the MRAM data. By design, both the parallel and antiparallel configurations remain stable in the quiescent state and/or during a read operation (at sufficiently low read current).

In the remaining text and figures, direction of the write current is defined as the direction of the electron flow. Therefore, the term write current refers to an electron current.

To "set" the MRAM cell bit value (i.e., choose the direction of the free layer magnetization), a write current 62 is applied from conductor 60 to conductor 70. The electrons in the write current become spin-polarized as they pass through pinned layer 52 because pinned layer 52 is a ferromagnetic metal. While conduction electrons in a ferromagnetic metal will have spin orientation collinear with the direction of magnetization, a substantial majority of them will have a particular orientation that is parallel to the direction of magnetization, yielding a net spin polarized current. (Electron spin refers to angular momentum, which is directly proportional to but antiparallel in direction to the magnetic moment of the electron, but this directional distinction will not be used going forward for ease of discussion.) When the spin-polarized electrons tunnel across the tunnel barrier 56, conservation of angular momentum can result in the imparting of a torque on both free layer 54 and pinned layer 52, but this torque is inadequate (by design) to effect the magnetization direction of the pinned layer. Contrastingly, this torque is (by design) sufficient to switch the magnetization orientation in the free layer 54 to become parallel to that of the pinned layer 52 if the initial magnetization orientation of the free layer 54 was antiparallel to the pinned layer 52. The parallel magnetizations will then remain stable before and after such write current is turned off. In contrast, if free layer 54 and pinned layer 52 magnetizations are initially parallel, the free layer magnetization can be STT-switched to become antiparallel to the pinned layer 52 by application of a write current of opposite direction to the aforementioned case. Thus, by way of the same STT physics, the direction of the magnetization of free-layer 54 can be deterministically set into either of two stable orientations by judicious choice of the write current direction (polarity).

The MRAM memory cell of FIG. 1B uses materials in which both the pinned and free-layer magnetization are in the in-plane direction. In contrast, FIG. 1C depicts a schematic representation of a STT-switching MRAM memory cell 75 in which both the pinned and free-layer magnetization are in the perpendicular direction. Memory cell 75 includes a magnetic tunnel junction (MTJ) 76 comprising an upper ferromagnetic layer 78, a lower ferromagnetic layer 80, and a tunnel barrier (TB) 82 which is an insulating layer between the two ferromagnetic layers. In this example, lower ferromagnetic layer 80 is the free layer FL and the direction of its magnetization can be switched. Upper ferromagnetic layer 78 is the pinned (or fixed) layer PL and the direction of its magnetization is not easily changed. When the magnetization in free layer 80 is parallel to the magnetization in pinned layer PL 78, the resistance across the memory cell 75 is relatively low. When the magnetization in free layer FL 80 is anti-parallel to the magnetization in pinned layer PL 78, the resistance across memory cell 50 is relatively high. The data ("0" or "1") in memory cell 75 is read by measuring the resistance of the memory cell 75. In this regard, electrical conductors 84/88 attached to memory cell 75 are utilized to read the MRAM data. By design, both the parallel and antiparallel configurations remain stable in the quiescent state and/or during a read operation (at sufficiently low read current). To "set" the MRAM cell bit value (i.e., choose the direction of the free layer magnetization), a write current 86 is applied from conductor 84 to conductor 88 and the memory cell operates as discussed above with respect to FIG. 1B.

Compared to the earliest MRAM cells which used magnetic fields from current carrying conductors proximate to the MRAM cell, the STT switching technique requires relatively low power, virtually eliminates the problem of adjacent bit disturbs, and has more favorable scaling for higher cell densities (reduced MRAM cell size). The latter issue also favors STT-MRAM where the free and pinned layer magnetizations are orientated perpendicular to the film plane, rather than in-plane. In practice, however, STT switching requires that the full write current must flow through the tunnel barrier, which negatively affects long term reliability of the STT MRAM cell due to the necessary stress of moderate to high write voltages across the tunnel barrier.

FIG. 1D depicts an alternative MRAM memory cell 100 that makes use of spin orbit torque (SOT) for switching the free layer. In general, Spin Hall Effect (SHE) may be used to generate spin current flowing in a transverse (perpendicular to plane) direction when applying a charge current flow in a longitudinal (in-plane) direction. The spin polarization direction of such an SHE-generated spin current is in the in-plane direction orthogonal to the charge current flow. Memory cell 100 includes three terminals A, B and C; magnetic tunnel junction (MTJ) 101 and SHE material 120. In one implementation, MTJ 101 could comprise a free layer, a tunnel barrier and a pined layer. In another implementation, MTJ 101 comprises pinned layer (PL) 102, inter-layer coupling (ILC) layer 104, reference layer (RL) 106, tunnel barrier (TB) 108 and free layer (FL) 110. The ILC layer 104 promotes a strong antiferromagnetic (i.e., anti-parallel) coupling between PL (102) and RL (106), such that their net magnetic moment mostly cancels, thus greatly reducing unwanted stray field on the free layer. SHE layer 120 comprises a heavy metal, such as Platinum, Tantalum or Tungsten, that has strong SHE.

The primary advantage of the SOT-switching design that exploits the SHE is that the write current 122 passes solely through the SHE layer 120, and does not flow at all through the tunnel barrier 108. This eliminates the aforementioned long term degradation of the tunnel barrier by the switching current in the prior STT switching design for MRAM cells. However, a substantial disadvantage of the SOT switching design (FIG. 1D) is a consequence of the fact that the SHE generated spin current flowing from SHE 120 into the free layer 110 has a spin polarization in-plane (i.e., orthogonal to free layer magnetization), rather than perpendicular-to-plane (i.e., collinear with free layer magnetization) as was the case for the STT switching design (FIG. 1B). The negative consequences of this orthogonality are twofold. Firstly, the critical write current density in the SHE layer 120 needed to begin the onset of the switching process can be many times larger than that for STT switching, because the physics of the switching process makes orthogonal SOT switching less intrinsically efficient than that of STT switching. Secondly, SHE-induced orthogonally polarized spin current entering the free layer 110 is destabilizing to either free layer orientation, and by itself cannot be used to deterministically set a preferred free layer magnetization direction. While this problem can be alleviated by applying an external bias field in a direction collinear with the charge current flow in the SHE layer 120, it would be a great technical difficulty to achieve means to provide the necessary strength of magnetic field at the cell level in a practical MRAM memory.

Another approach to solve the "orthogonality problem" intrinsic to SOT switching as shown in FIG. 1D is to instead use in-plane magnetized free layers and pinned layers, so the magnetization is once again collinear with the spin-polarization direction of the injected SHE-induced spin current. However, that option has the same aforementioned MRAM cell size scaling disadvantages which previously drove the technological preference towards perpendicular MRAM cell design, as is known in the art. What is needed is an efficient MRAM cell design where the write current does not pass through the tunnel barrier, and which allows for deterministic switching of perpendicular free layer simply by choice of write current polarity.

To remedy the above described deficiencies of prior MRAM memory cells, a new MRAM memory cell is proposed that is based on spin accumulation torque. One embodiment includes a magnetic tunnel junction, a spin accumulation layer (SAL) electrically connected to the magnetic tunnel junction, and a ferromagnetic polarization layer electrically connected to the SAL. The polarized spin current injected into the SAL from the polarization layer can then spread out and accumulate a net spin density throughout the SAL. The spins that accumulate directly below the position of the free layer can diffuse vertically into the free layer, constituting an induced spin polarized current into the free layer somewhat analogous to the SHE MRAM cell of FIG. 1D. However, in the case of spin accumulation, the spin polarization direction is determined by that of the ferromagnetic polarization layer. If the magnetization of the polarization layer is fixed perpendicular to the plane, then the present invention has the potential to combine the advantages of SHE (i.e., no write current flow through the tunnel barrier) and STT (efficient, deterministic switching of a perpendicular magnetized free layer) without the drawbacks of either. For completeness, it is noted that the spin accumulation MRAM cell is also compatible with in-plane magnetization design.

Figure 2A:
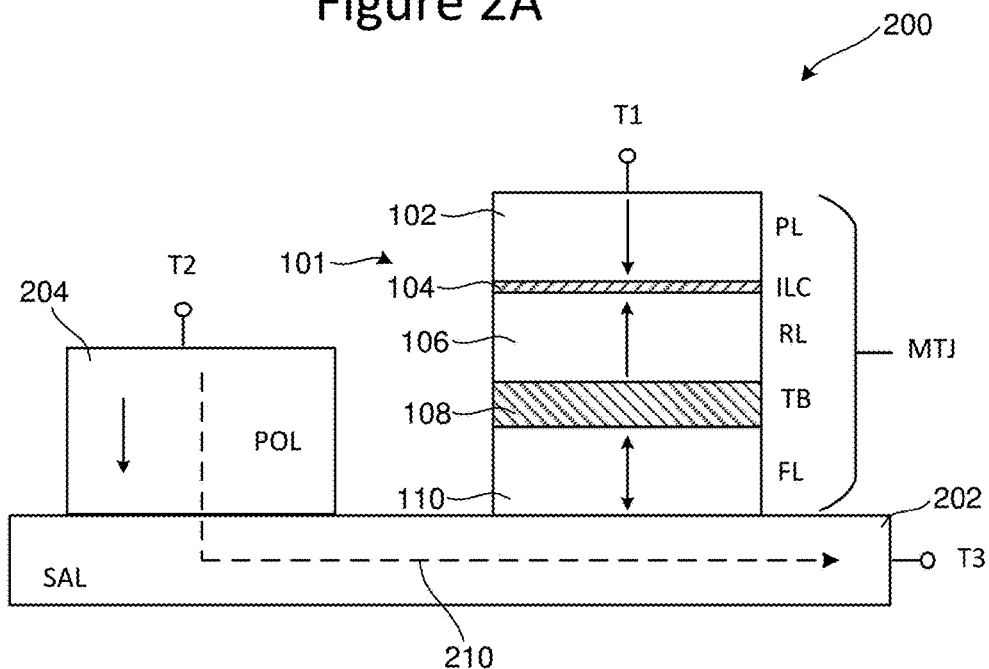
FIG. 2A is a block diagram of a MRAM memory cell.
Figure 2B:
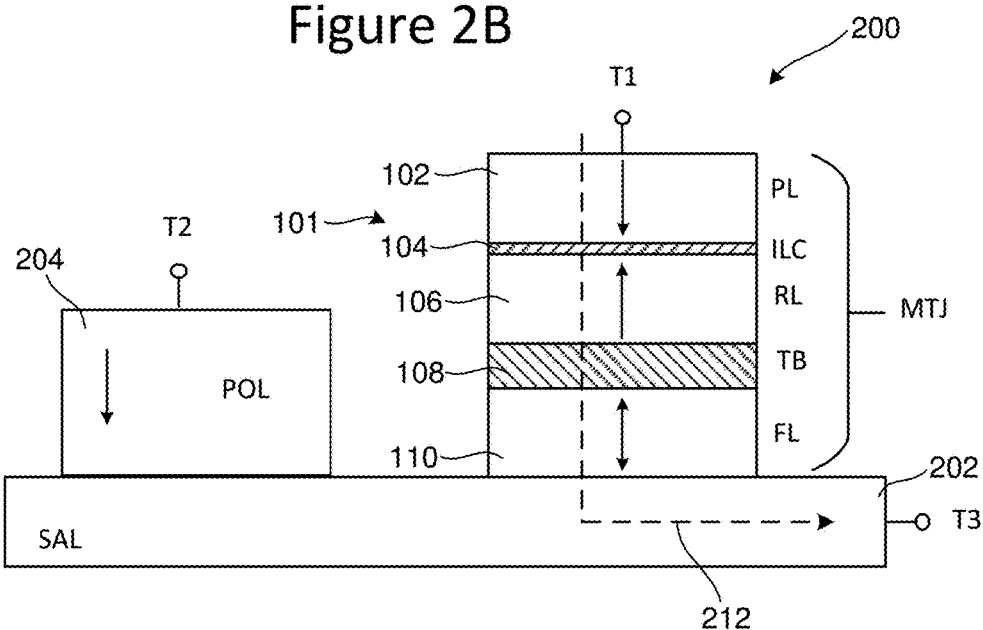
FIG. 2B is a block diagram of a MRAM memory cell.

FIGS. 2A and 2B depict one embodiment of a MRAM memory cell 200 that uses spin accumulation torque to switch. MRAM memory cell 200 includes three terminals T1, T2 and T3; magnetic tunnel junction (MTJ) 101; spin accumulation layer 202; and polarization layer 204. In one implementation, MTJ 101 could comprise a free layer, a tunnel barrier and a pinned layer. In one implementation, as depicted in FIG. 2A, MTJ 101 is positioned on top of and in electrical contact with spin accumulation layer (SAL) 202 and comprises pinned layer (PL) 102, inter-layer coupling (ILC) layer 104, reference layer (RL) 106, tunnel barrier (TB) 108 and free layer (FL) 110. In the embodiment graphically depicted in FIG. 2A, free layer 110 is positioned on top of SAL 202, tunnel barrier 108 is positioned on top of free layer 110, reference layer 106 is positioned on top of tunnel barrier 108, ILC layer 104 is positioned on top of reference layer 106, and pinned layer 102 is positioned on top of ILC layer 104. Other positioning of the various layers can also be implemented.

Pinned layer 102 and reference layer 106 have fixed magnetizations, meaning that the direction of their magnetizations does not change. Pinned layer 102 can be many different types of materials including (but not limited to) multiple layers of Cobalt and/or Platinum. Reference layer 106 can be many different types of materials including (but not limited to) multiple layers of Cobalt and Platinum next to an alloy of Cobalt, Iron and Boron. In one example, ILC layer 104 is made of Ruthenium; however, other materials can also be used. Pinned layer 102 has a direction of magnetization that is opposite in direction than reference layer 106. For example, FIG. 2A shows the direction of magnetization of pinned layer 102 being down and the direction of magnetization of reference layer 106 being up. To some degree, the magnetization of reference layer 106 cancels out a portion of the magnetization of pinned layer 102 (or vice versa) to create in aggregate one or more layers of fixed magnetization (i. e. fixed direction of magnetization), also referred to as a fixed ferromagnetic layer.

In one example, tunnel barrier 108 is made of Magnesium Oxide (MgO); however, other materials can also be used. Tunnel barrier 108 is positioned between free layer 110 and the one or more layers of fixed magnetization; thus, tunnel barrier 108 is positioned between free layer 110 and reference layer 102. Free layer 110 is a ferromagnetic metal that possess the ability to change/switch direction of its magnetization. Multilayers based on transition metals like Co, Fe and CoFe and noble metals such as Pt, Pd and Au can be used. Some examples include Co/Pd, Co/Pt and Co/Ni. In one embodiment, free layer 110 comprises an alloy of Cobalt, Iron and Boron.

SAL 202 can be a highly conductive metal (or possibly semiconductor) with long spin diffusion length and good spin mixing interface properties with polarization layer 204 in order to maximize spin injection and accumulation. Examples of materials that can be used to implement SAL 202 include silver, copper or alloys of silver/copper. Other suitable materials can also be used. Thus, while SHE layer 120 of MRAM memory cell 100 shown in FIG. 1C is typically a (heavy) metal with high spin-orbit coupling (and generally corresponding high resistivity and short spin diffusion length), SAL 202 of memory cell 200 is a good electrical conducting metal (or possibly semiconductor) which can readily transport spin current from polarization layer to the MRAM cell locations.

Polarization layer 204, which has a fixed direction of (preferably perpendicular) magnetization, is positioned on top of and in good electrical contact with spin accumulation layer 202 and to one side of MTJ 101. Polarization layer 204 is a high spin polarized ferromagnetic layer. For example, polarization layer 204 can be an alloy of Cobalt and Iron, or an alloy of Cobalt and Manganese. Other suitable materials can also be used.

The embodiment graphically depicted in FIG. 2A shows the direction of (perpendicular) magnetization of pinned layer 102 being down, the direction of magnetization of reference layer 106 being up, the direction of magnetization of free layer 110 being switchable between up and down, and the direction of magnetization of polarization layer 204 being down. Therefore, pinned layer 102, reference layer 106, free layer 110 and polarization layer 204 are perpendicularly magnetized. In another embodiment, pinned layer 102, reference layer 106, free layer 110 and polarization layer 204 can have in-plane direction of magnetization.

Terminal T1 is connected to pinner layer 102. Terminal T2 is connected to polarization layer 204. Terminal T3 is connected to an end of spin accumulation layer 202 proximal to MTJ 200.

Referring to FIG. 2A, for a write operation where the free layer magnetization is to be switched from up to down, the flow of injected electrons would be from terminal T2, to terminal T3. This generates a spin-accumulation of down spins in the SAL, which leads to a (diffusion) spin current flow into the free layer of down polarized spins. If free layer magnetization was already down, no change would occur. Analogously, for a write operation to switch the free layer magnetization from down to up, the write current polarity would be reversed (electrons flow from Terminal 3 to Terminal 2). This generates a spin accumulation of up spins in the SAL. If the free layer magnetization was already up, no change would occur. As far as the spin (rather than charge) currents are concerned, the situation here is somewhat analogous to that described for the STT MRAM cell of FIG. 1B, if one imagines the polarization layer magnetization playing the analogous role to that of the magnetization of pinned layer 52. For the embodiment of FIG. 2A, write efficiency is maximized if the lateral width of polarization layer 204 and the extension (if any) of left edge of SAL past left edge of polarization layer 204 be comparable or (preferably) less than the spin diffusion length in the SAL material. This minimizes spin diffusion to the left and maximizes spin accumulation in the SAL to the right of polarization layer 204 nearest the location of the MTJ 101.

FIG. 3A is a flow chart describing one embodiment of a process for writing to a MRAM memory cell. Write current 210 is applied from terminal T2 to terminal T3, such that the electron current is provided from polarization layer 204 to and through spin accumulation layer 202, to create spin accumulation under free layer 110 due to spin injection. These spins exert spin torque on free layer 110 via spin diffusion. Different polarities of write current 210 are applied for writing 1 and 0 (switching the direction of magnetization of free layer 110). When write current 210 is applied from terminal T2 to terminal T3 (step 250), electrons get spin polarized as they pass through polarization layer 204 (step 252) as polarization layer 204 is a ferromagnetic metal and all electrons in a ferromagnetic metal have the spin orientation collinear with the magnetization. The spin-polarized electrons, having the same direction of magnetization as polarization layer 204 (e.g., down), are injected into spin accumulation layer 202 as per arrow 210 (step 254). From the spin accumulation layer 202, some of the spin-polarized electrons diffuse into free layer 110 (step 256). If the direction of magnetization of free layer 110 is the opposite of direction (e.g., up) as the direction of magnetization as polarization layer 204 then through conservation of angular momentum, the electrons impart a spin transfer torque on free layer 110 (step 258). This torque causes the magnetization orientation in the free layer 110 to change to the same as the polarization layer 204 (step 260), thus, the direction of magnetization in free layer 110 becomes parallel (ie same direction) to the direction of magnetization of polarization layer 204 and parallel to the direction of magnetization of pinned layer 102.

The parallel magnetizations will remain stable until a write current of opposite direction switches the direction of magnetization in free layer 110 to be anti-parallel to the direction of magnetization in polarization layer 204, as described by the process of FIG. 3B. That is, a write current of opposite direction to current 210 (e.g., a write current applied from terminal T3 to terminal T2) is applied (step 270). The electrons will be forced from spin accumulation layer 202 toward polarization layer 204 (step 272). Some of these electrons will have a spin associated with the same direction of magnetization of polarization layer 204 (which, at this point, is the same direction of magnetization as free layer 110) and some of the electrons will have a spin associated with a direction opposite the direction of magnetization of polarization layer 204. Electrons flowing in SAL with spin parallel (antiparallel) to that of the magnetization of polarization layer will be preferentially transmitted (reflected) at the SAL/polarization layer interface, resulting in a net spin-accumulation in the SAL that is polarized in the opposite direction to the magnetization of the polarization layer. (step 274) From the SAL 202 some of the pin polarized electrons will diffuse into the free layer 110 (step 276). Through conservation of angular momentum, these electrons will impart a torque on free layer 110 (step 278). This torque causes the spin orientation in the free layer to change to be opposite to the polarization layer, thus, the direction of magnetization in free layer becomes antiparallel to the direction of magnetization of polarization layer and antiparallel to the direction of magnetization of pinned layer (step 280).

To perform reading, a read current 212 (see FIG. 2B) is applied from terminal T1 through MTJ 101 to terminal T3. The read current 212 is typically a low current that will not harm tunnel barrier 108. By sensing the voltage drop across terminals T1 and T3, the resistance of MTJ 101 can be determined. When the magnetization in free layer 110 is parallel to the magnetization in reference layer 106 (or the combination of pinned layer 102 and reference layer 106), the resistance across memory cell 200 is relatively low. When the magnetization in free layer 110 is anti-parallel to the magnetization in reference layer 106 (or the combination of pinned layer 102 and reference layer 106), the resistance across memory cell 200 is relatively high. Thus, MTJ 101 exhibits a programmable resistance that can be detected in response to a read bias.

In comparison to the memory cells of FIGS. 1A-D, MRAM memory cell 200 switches magnetization more efficiently and deterministically without the need for an external field and without the need for a high write current running through the tunnel barrier 108. Additionally, MRAM memory cell 200 can be scaled without the disturb problems of other memory cells.

Figure 4:
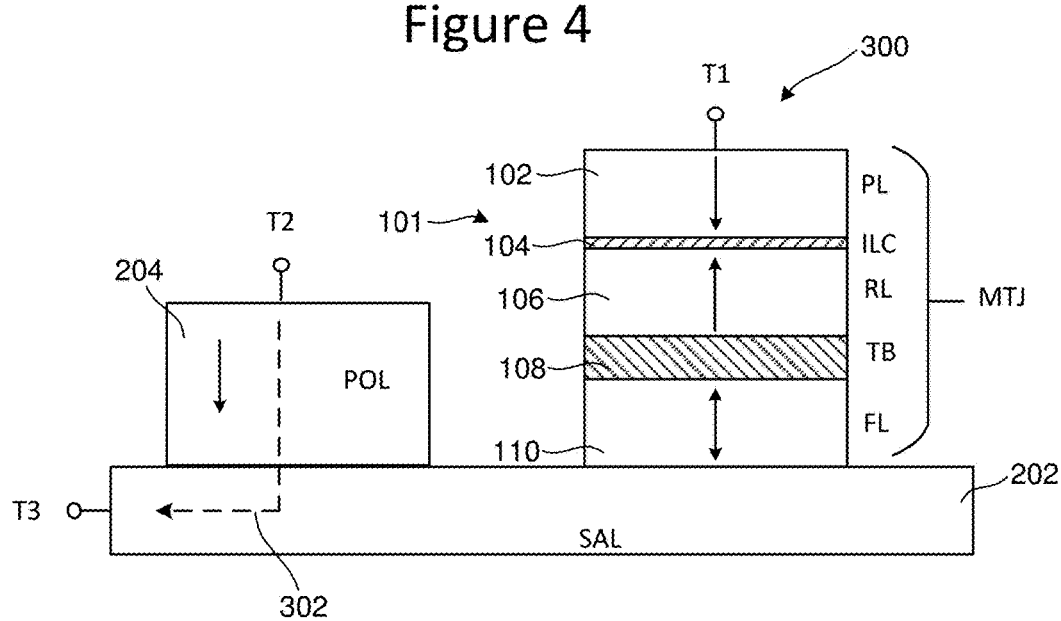
FIG. 4 is a block diagram of a MRAM memory cell.

FIG. 4 depicts another embodiment of a spin-accumulation MRAM memory cell. As depicted, memory cell 300 includes the same MTJ 101, SAL 202 and polarization layer 204 as memory cell 200 of FIGS. 2A and 2B. However, memory cell 300 of FIG. 4 positions terminal T3 at the opposite end of spin accumulation layer (SAL) 202 as compared to memory cell 200 of FIGS. 2A and 2B. The write current 210 of FIG. 2A is replaced with write current 302 from terminal T2 to T3 such that write current 302 goes from polarization layer 204 to terminal T3 via SAL 202 without passing under MTJ 101 (while in FIG. 2A write current 210 passed under MTJ 101). Thus, in the embodiment of FIG. 2A the magnetic tunnel junction 101 is positioned at the SAL 202 between the first polarization layer 204 and the third terminal T3 while in the embodiment of FIG. 4 the first polarization layer 204 is positioned at the spin accumulation layer 202 between the magnetic tunnel junction 101 and the third terminal. The third terminal T3 does not need to be on the other side of MTJ 101 because spin polarized electrons diffuse throughout the SAL 202 regardless of the direction/path of the current. The operation of memory cell 300 (both write operations and the read operation) are the same as described above for memory cell 200 of FIGS. 2A and 2B, including reading by passing a current through MTJ 101. Memory cell 300 is depicted with perpendicular magnetization, but could also implement in-plane magnetization. For memory cell 300, write efficiency can be maximized if the lateral extension of SAL 202 past the MTJ 101 (e.g, to the right of MTJ 101 in FIG. 4) is limited to be comparable or less than spin diffusion length in the SAL material. This helps confine the spin accumulation in SAL 202 to location underneath the MTJ 101, and thus increases the spin accumulation torque on free layer 110. It also compensates for the loss (by comparison to embodiment of FIG. 2A) of spin accumulation in the SAL that is in proximity of MTJ 101 due to spin diffusion in the SAL 202 to the left (in FIG. 4) of polarization layer 204 and away from the MTJ 101. The design of memory cell 300 also reduces or eliminates high charge current density under free layer 110, thereby reducing (to some degree) the thermal stress of MTJ 101 due to Joule heating of the SAL 202.

Figure 5:
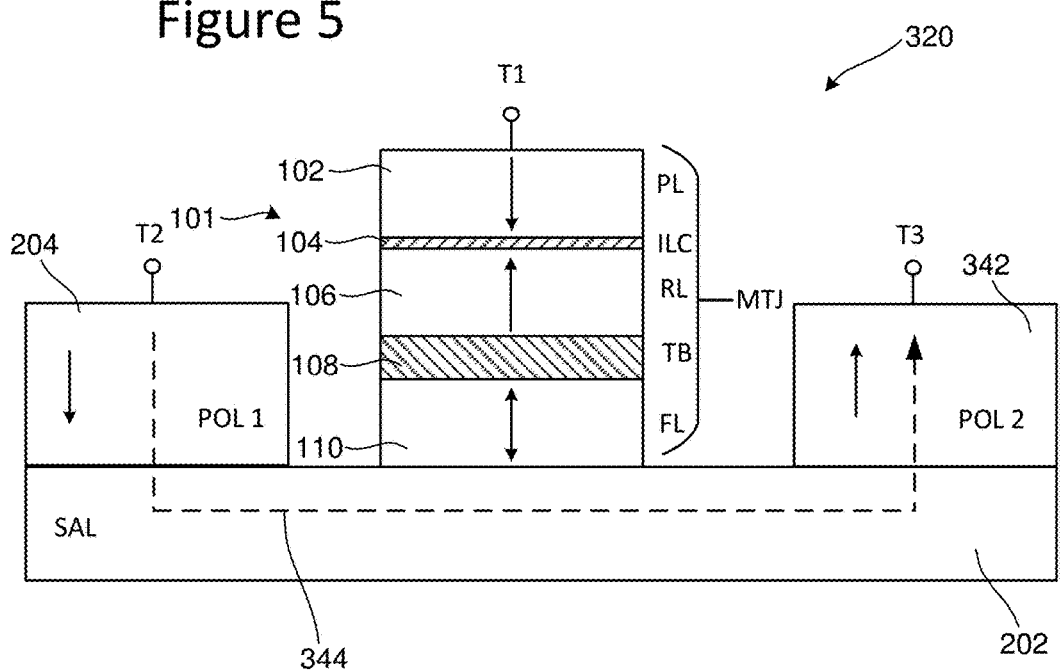
FIG. 5 is a block diagram of a MRAM memory cell.

FIG. 5 depicts another embodiment of an MRAM memory cell with two polarization layers. Memory cell 320 includes the MTJ 101, SAL 202, polarization layer 204 and polarization layer 342. In one embodiment, polarization layer 342 can be made from any of the materials discussed above with respect to polarization layer 204. Polarization layer 342 has a fixed direction of magnetization in the opposite direction to the direction of magnetization of polarization layer 204 and is similarly in electrical contact with SAL layer 202 on the opposite side of MTJ 101 as polarization layer 204. In the embodiment of FIG. 5, terminal T1 is connected to pinned layer 102, terminal T2 is connected to polarization layer 204 and terminal T3 is connected to polarization layer 342.

The write current 210 of FIG. 2A is replaced with write current 344 from (to) terminal T2 to (from) T3 such that write current 344 goes from (to) polarization layer 204 to (from) polarization layer 342 via SAL 202 (passing under MTJ 101). The presence of the two polarization layers 204 and 342 each create a spin current that is injected into free layer 110 during write operations. Provided the two polarization layers are magnetized in opposite directions, the two spin currents add together to the spin accumulation in the SAL to make the write process more efficient (possibly as much as twice more). The write efficiency is further increased (again by as much as twice) if the lateral widths of polarization layers 204 and 342, and the extension (if any, but none shown in FIG. 5) of the far edges of SAL past far edges of polarization layers 204 and 342 be comparable or (preferably) less than the spin diffusion length in the SAL material. This minimizes spin diffusion to the outer regions of SAL 202 and maximizes spin accumulation in the SAL in the central region of SAL nearest the location of the MTJ 101. Thus, an optimized design of the embodiment of FIG. 5 could be 2-4 times more efficient that embodiments of FIGS. 2A and 4.

The operation of memory cell 320 (both write operations and the read operation) is the same as described above for memory cell 200 of FIGS. 2A and 2B, including reading by passing a current through MTJ 101. Memory cell 320 is depicted with perpendicular magnetization, but could also implement in-plane magnetization.

Figure 5A:
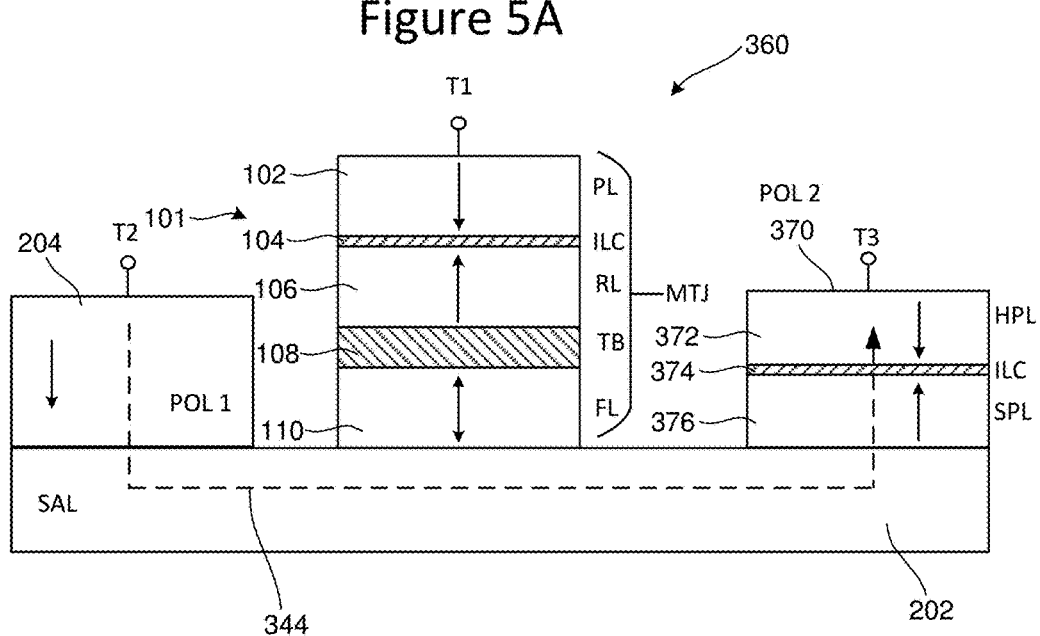
FIG. 5A is a block diagram of a MRAM memory cell.

In practice, achieving the fixed antiparallel magnetization directions of POL 1 (204) and POL 2 (342), as shown in FIG. 5, may be difficult. FIG. 5A depicts another embodiment of an MRAM memory cell 360 with two polarization layers 204 and 370. MRAM memory cell 360 of FIG. 5A is similar to MRAM memory cell 320 of FIG. 5, except the second polarization layer 342 of FIG. 5 is replaced with second polarization layer 370 of FIG. 5A. Polarization layer POL 2 370 is implemented by a structure comprising a "hard" polarizing-layer (HPL) 372, inter-layer coupling (ILC) layer 374, and a "soft" polarizing layer (SPL) 376. Being adjacent to the SAL 202, it is the direction of magnetization of the SPL 376 which determines the induced spin-polarization of the write current when passing it through POL 2 (370). In this embodiment, POL 1 (204), the PL/ILC/RL composite (layers 102, 104, and 106) of MRAM cell 360, and the HPL 372 and SPL 374 can all be simultaneously initialized by a large magnetic field in the "down" direction. As is analogously the case for the PL/ILC/RL structure, the HPL/ILC/SPL is designed such that the magnetization of HPL layer 372 (and also the magnetization of PL 102) will remain magnetized "down" after the initializing field is removed, at which time the SPL 376 (and analogously, the RL 106) will flip magnetization direction to be "up" as a direct results of the exchange interaction mediated by the ILC layers (either 374 or 104). POL 1 layer 204 also being magnetically "hard", will too remain magnetized "down". As a result, the desired magnetization directions of all magnetic layers 204, 102, 106, and 376, such as shown in FIG. 5A, can be achieved by a single application of a fixed direction of initializing field, after which MRAM memory cell 360 should be the functional equivalent of MRAM memory cell 320 of FIG. 5.

Figure 6:
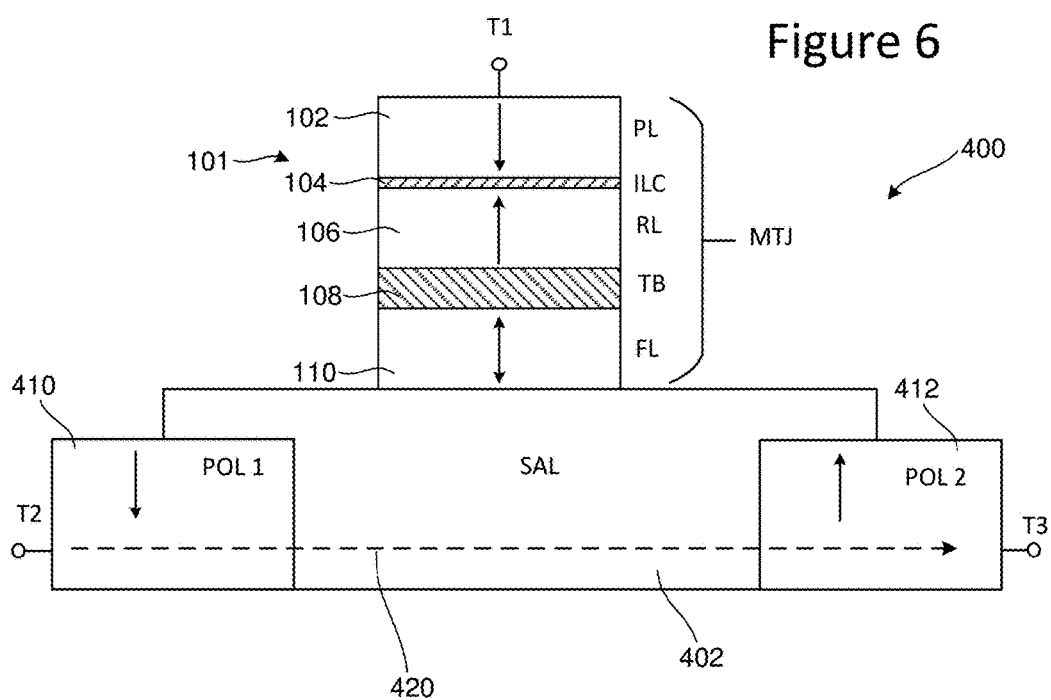
FIG. 6 is a block diagram of a MRAM memory cell.

FIG. 6 depicts another embodiment of an MRAM memory cell with two polarization layers under and in the spin accumulation layer. Memory cell 400 includes the MTJ 101, spin accumulation layer 402, polarization layer 410 and polarization layer 412. Terminal T1 is connected to pinned layer 102, terminal T2 is connected to polarization layer 410 and terminal T3 is connected to polarization layer 412. Spin accumulation layer 402 can be made from the same materials as spin accumulation layer 202. Polarization layer 410 and polarization layer 412 can be made from the same materials as polarization layer 204. Polarization layer 410 and polarization layer 412 have opposite directions of magnetization; for example, polarization layer 410 has a direction of magnetization of down and polarization layer 412 has a direction of magnetization of up. Polarization layer 410 and polarization layer 412 are embedded in spin accumulation layer 202. Memory cell 400 operates in the same manner as memory cell 320, with write current 344 of memory cell 320 being implemented as write current 420. Memory cell 400 is depicted with perpendicular magnetization, but could also implement in-plane magnetization.

Figure 7:
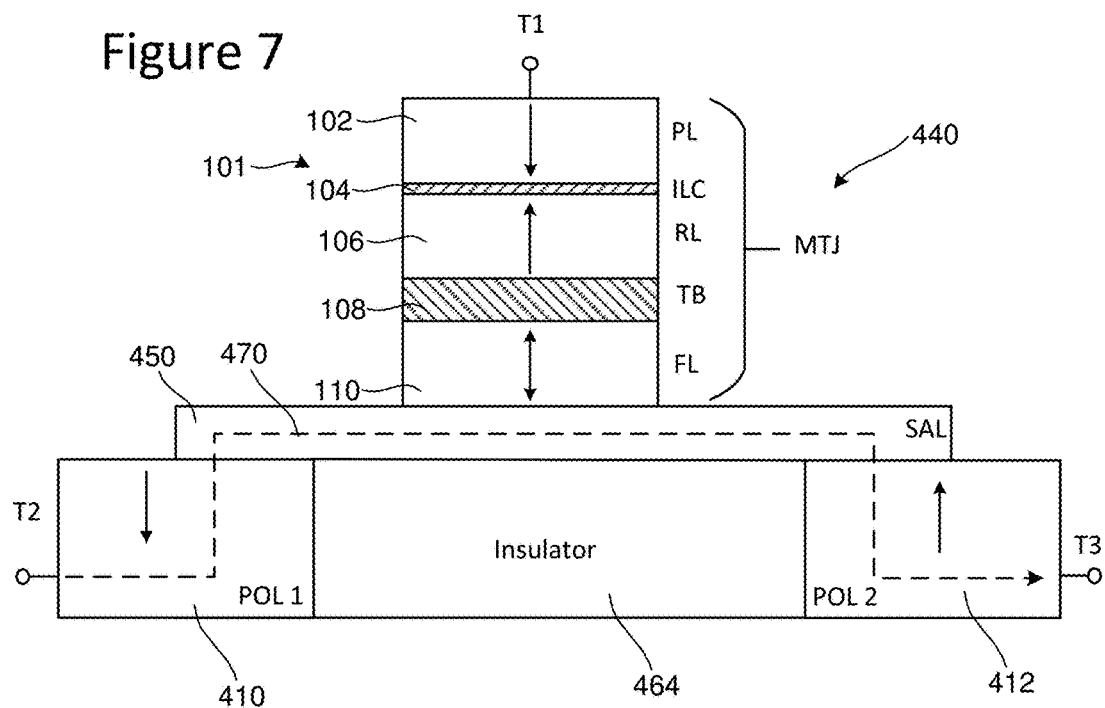
FIG. 7 is a block diagram of a MRAM memory cell.

FIG. 7 depicts another embodiment of an MRAM memory cell with two polarization layers under and in the spin accumulation layer. Memory cell 440 includes the MTJ 101, spin accumulation layer 450, polarization layer 410 and polarization layer 412. Terminal T1 is connected to pinned layer 102, terminal T2 is connected to polarization layer 410 and terminal T3 is connected to polarization layer 412. Spin accumulation layer 450 can be made from the same materials as spin accumulation layer 202. Polarization layer 410 and polarization layer 412 are positioned under spin accumulation layer 450. Insulator 464 is also positioned under spin accumulation layer 450, between polarization layer 410 and polarization layer 412. Insulator 464 can be $Al_2O_3$, SiN, $SiO_2$, TaOx or other suitable materials. Memory cell 440 operates in the same manner as memory cell 400, with write current 420 of memory cell 400 being implemented as write current 470 (from T2 to T3). Memory cell 440 is depicted with perpendicular magnetization, but could also implement in-plane magnetization. In one embodiment, second polarization layer 412 of MRAM memory cell 440 can be implemented by a structure comprising a "hard" polarizing layer, an inter-layer coupling layer, and a "soft" polarizing layer in the same manner as polarization layer 370 of FIG. 5A.

Figure 7A:
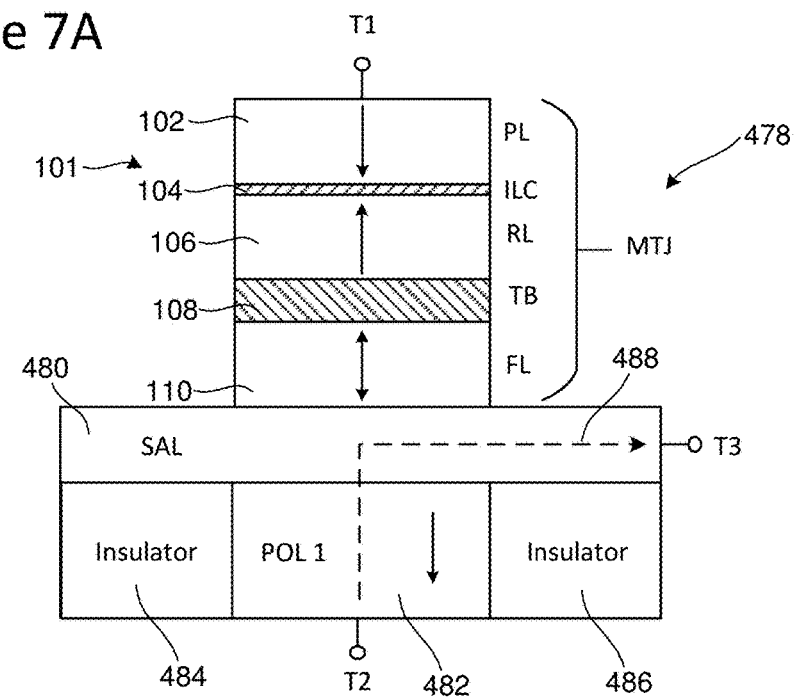
FIG. 7A is a block diagram of a MRAM memory cell.

FIG. 7A depicts another embodiment of an MRAM memory cell with the polarization layer directly under the spin accumulation layer and the free layer. This embodiment is important as it avoids performance issues with potentially low spin diffusion length in the region of the spin accumulation layer extending beyond FL edges that may arise from milling the magnetic material on top. Memory cell 478 includes the MTJ 101, spin accumulation layer (SAL) 480, polarization layer 482, insulator 484 and insulator 486.

Insulator 484 and insulator 486 are positioned below SAL 480. Polarization layer 482 is positioned below SAL 480 and between insulator 484 and insulator 486. Polarization layer 482 is positioned directly below free layer 110. Terminal T1 is connected to pinned layer 102, terminal T2 is connected to polarization layer 482 and terminal T3 is connected to SAL 480. SAL 480 can be made from the same materials as SAL 202. Insulators 484 and 486 can be $Al_2O_3$, SiN, $SiO_2$, TaOx or other suitable materials. Memory cell 478 operates in the same manner as memory cell 400, with write current 488 of memory cell 478 being implemented as a write current from T2 to T3. Memory cell 478 is depicted with perpendicular magnetization, but could also implement in-plane magnetization.

The width of the polarization layer 482 is approximately equal to the width of the FL 110; however, polarization layer 482 can be made wider or narrower than FL 110. One advantage of this design is that it is most compact implementation of the spin accumulation torque MRAM memory cell, so it would enable the highest density memory chip based on this switching mechanism. One drawback of the above design (compared to having the polarization layer outside of the edge of the free layer) is that roughly only half of the spin accumulation current will be created. This loss, however, is likely to be approximately offset by the efficiency gained by having the polarization layer in such close proximity to the free layer.

Figure 9:
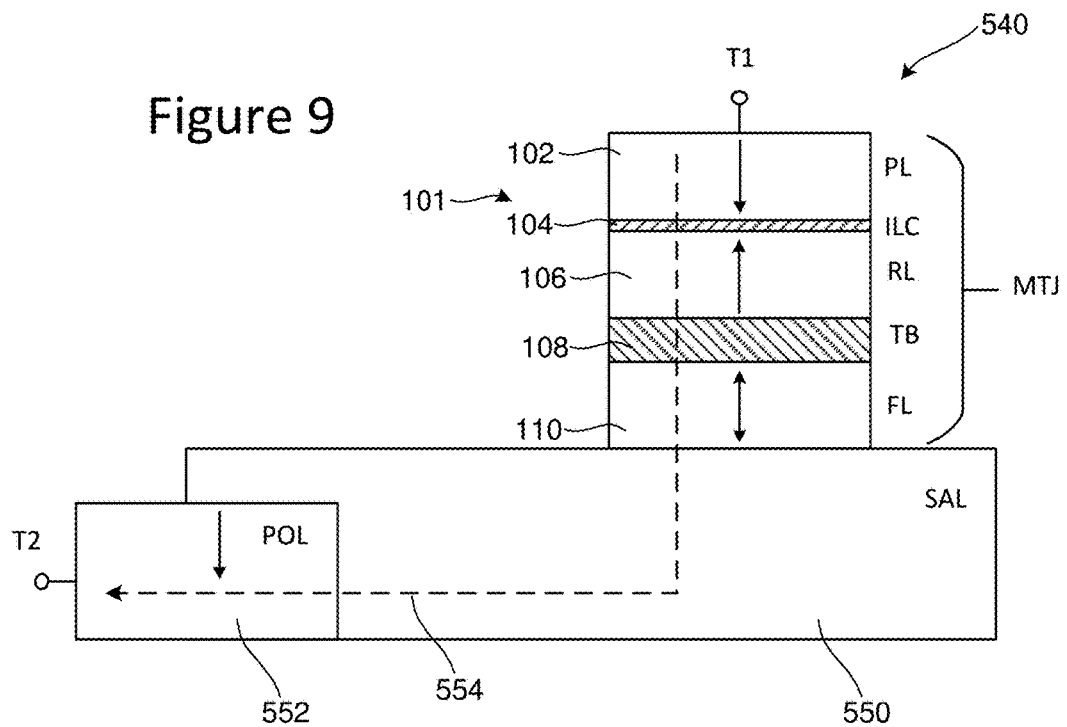
FIG. 9 is a block diagram of a MRAM memory cell.
Figure 10:
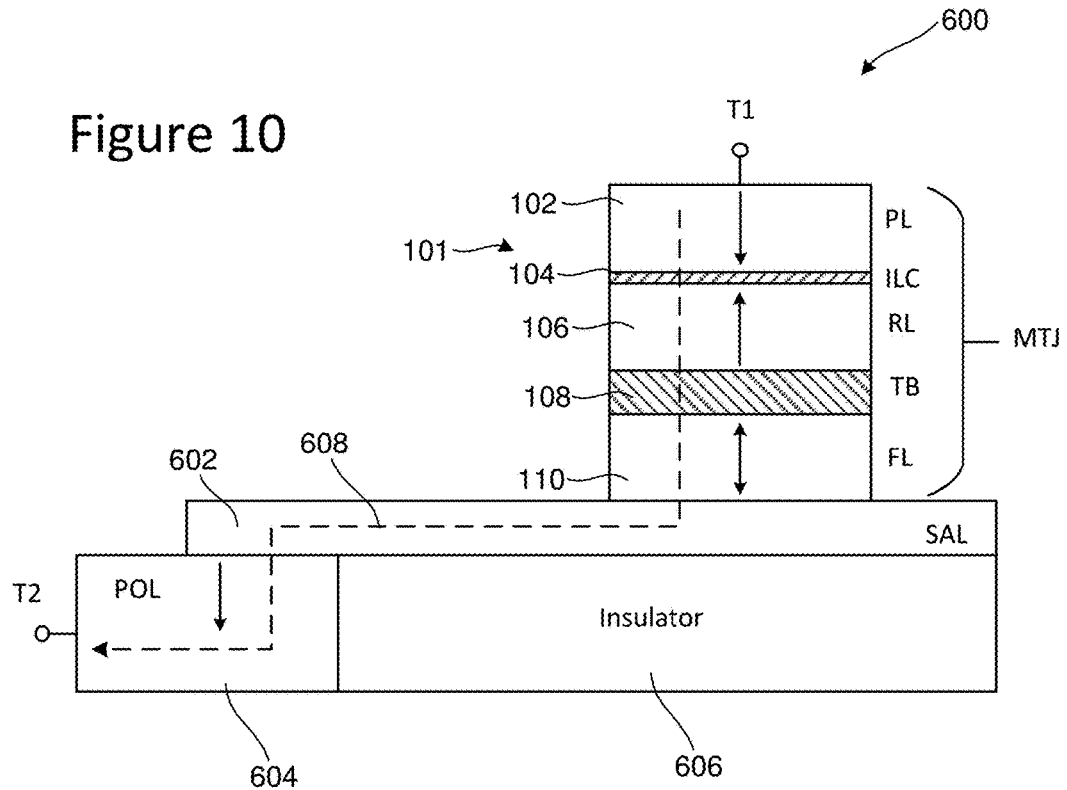
FIG. 10 is a block diagram of a MRAM memory cell.

Memory cells 200 (FIG. 2A), 300 (FIG. 4), 320 (FIG. 5), 360 (FIG. 5A), 400 (FIG. 6), 440 (FIG. 7) and 478 (FIG. 7A) are all three terminal spin accumulation torque MRAM memory cells that can implement perpendicular or in-plane magnetization. FIGS. 8-10 (discussed below) depict two terminal spin accumulation torque MRAM memory cells that can implement perpendicular or in-plane magnetization.

FIG. 8 depicts an embodiment of a MRAM memory cell that combines spin accumulation torque with spin transfer torque (STT). FIG. 8 depicts MRAM memory cell 500 that includes MTJ 101, spin accumulation layer 502, and polarization layer 506. Polarization layer 506, which has a fixed direction of magnetization, is positioned on top of and is in electrical contact with (but is separate from) spin accumulation layer 502 and to the side of MTJ 101. Polarization layer 506 can be made from the same materials as polarization layer 204. MTJ 101 is positioned on top of spin accumulation layer 502. Terminal T1 is connected to pinned layer 102 and terminal T2 is connected to polarization layer 506. Reading is performed in the same manner as discussed above with respect to FIGS. 2A and 2B.

Memory cell 500 combines the spin accumulation torque on the bottom of free layer 110 with spin transfer torque on the top surface of free layer 110. Provided the magnetization directions of RL 106 and polarization layer 506 are antiparallel, the two torques are additive in their effects, and work together so a lower write current 504 (from T1 to T2 via MTJ 101) compared to prior art STT (only). This reduces harm to the tunnel barrier 108. However, unlike the prior spin accumulation (only) MRAM cell embodiments described herein, the embodiment of FIG. 8 does not fully eliminate write current through the tunnel barrier.

FIG. 9 depicts another embodiment of a MRAM memory cell that combines the spin accumulation torque with the spin transfer torque, where the polarization layer is fabricated under the spin accumulation layer. Memory cell 540 includes MTJ 101, spin accumulation layer 550 and polarization layer 552. Polarization layer 552, which has a fixed direction of magnetization, is positioned in and/or under (but is separate from) spin accumulation layer 550 and to the side of MTJ 101. Polarization layer 552 can be made from the same materials as polarization layer 204. MTJ 101 is positioned on top of spin accumulation layer 550. Terminal T1 is connected to pinned layer 102 and terminal T2 is connected to polarization layer 552. Reading is performed in the same manner as discussed above with respect to FIG. 8. Writing, based on write current 554 from T1 to T2, is performed in the same manner as discussed above with respect to FIG. 8.

FIG. 10 depicts another embodiment of a MRAM memory cell that combines the spin accumulation torque with the spin transfer torque, where the polarizer is fabricated under the spin accumulation layer and an insulator is included. Memory cell 600 includes MTJ 101, spin accumulation layer 602 and polarization layer 604. Polarization layer 604, which has a fixed direction of magnetization, is positioned in and/or under (but is separate from) spin accumulation layer 602 and to the side of MTJ 101. Polarization layer 604 can be made from the same materials as polarization layer 204. MTJ 101 is positioned on top of spin accumulation layer 602. Terminal T1 is connected to pinned layer 102 and terminal T2 is connected to polarization layer 604. Reading is performed in the same manner as discussed above with respect to FIG. 8. Writing, based on write current 608 from T1 to T2, is performed in the same manner as discussed above with respect to FIG. 8.

Figure 11:
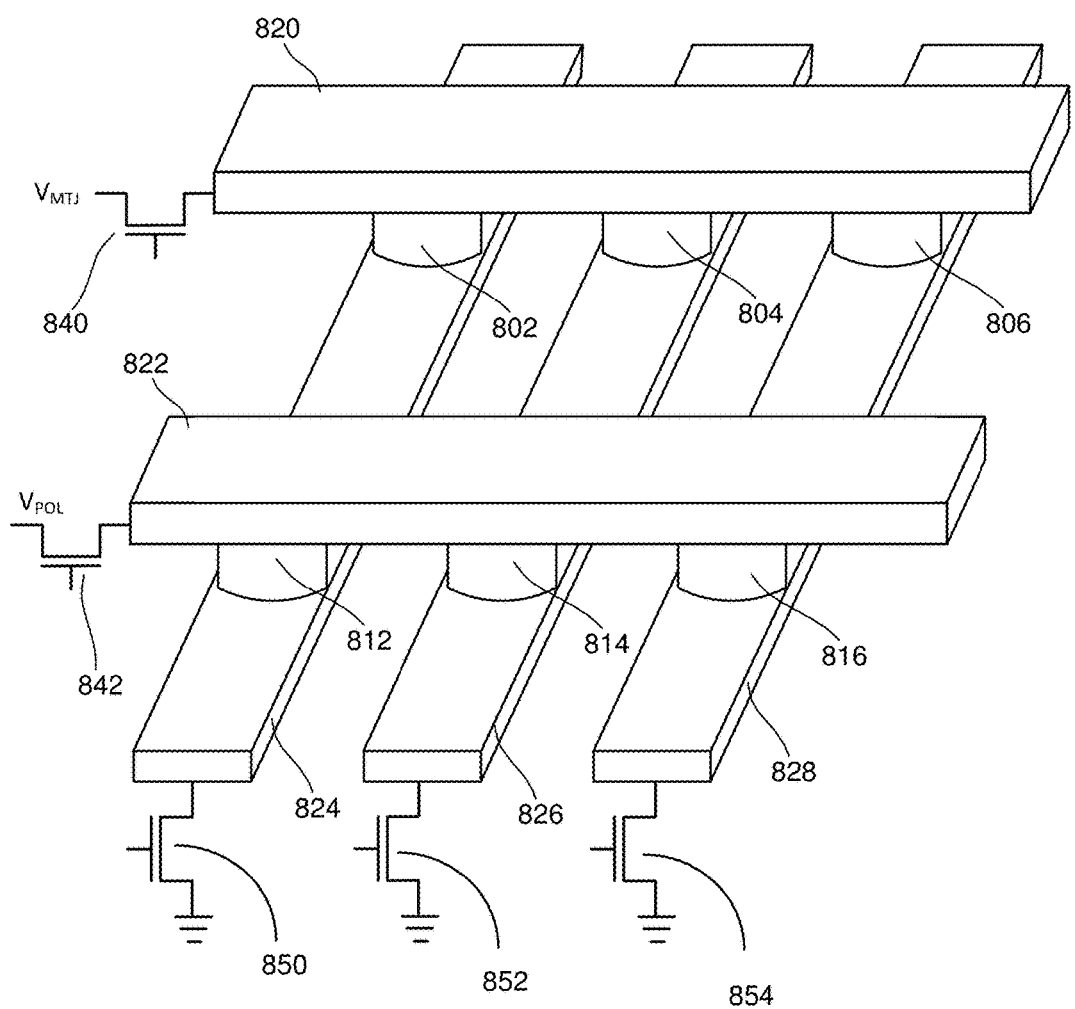
FIG. 11 depicts a portion of a cross point memory array.

FIG. 11 depicts a portion of a cross point memory array. Three memory cells are depicted; however, a full memory array will likely have millions of memory cells. The first memory cell includes MTJ 802 and polarization layer 812. The second memory cell includes MTJ 804 and polarization layer 814. The third memory cell includes MTJ 806 and polarization layer 816. Above and connected to MTJ 802, MTJ 804 and MTJ 806 is MTJ column 820, which is a conductor (i.e. metal line). Transistor 840 (also connected to $V_{MTJ}$) is used to activate/drive MTJ column 820. Above and connected to polarization layer 812, polarization layer 814 and polarization layer 816 is POL column 822, which is a conductor (i.e. metal line). Transistor 842 (also connected to $V_{POL}$) is used to activate/drive POL column 822. Below and connected to polarization layer 812 and MTJ 802 is row 824, which is an implementation of a spin accumulation layer. Below and connected to polarization layer 814 and MTJ 804 is row 826, which is an implementation of a spin accumulation layer. Below and connected to polarization layer 816 and MTJ 806 is row 828, which is an implementation of a spin accumulation layer. Transistor 850 is used to activate/drive row 824. Transistor 852 is used to activate/drive row 826. Transistor 854 is used to activate/drive row 828. The structure of FIG. 11 can be replicated many times to form a bigger memory array.

Figure 11A:
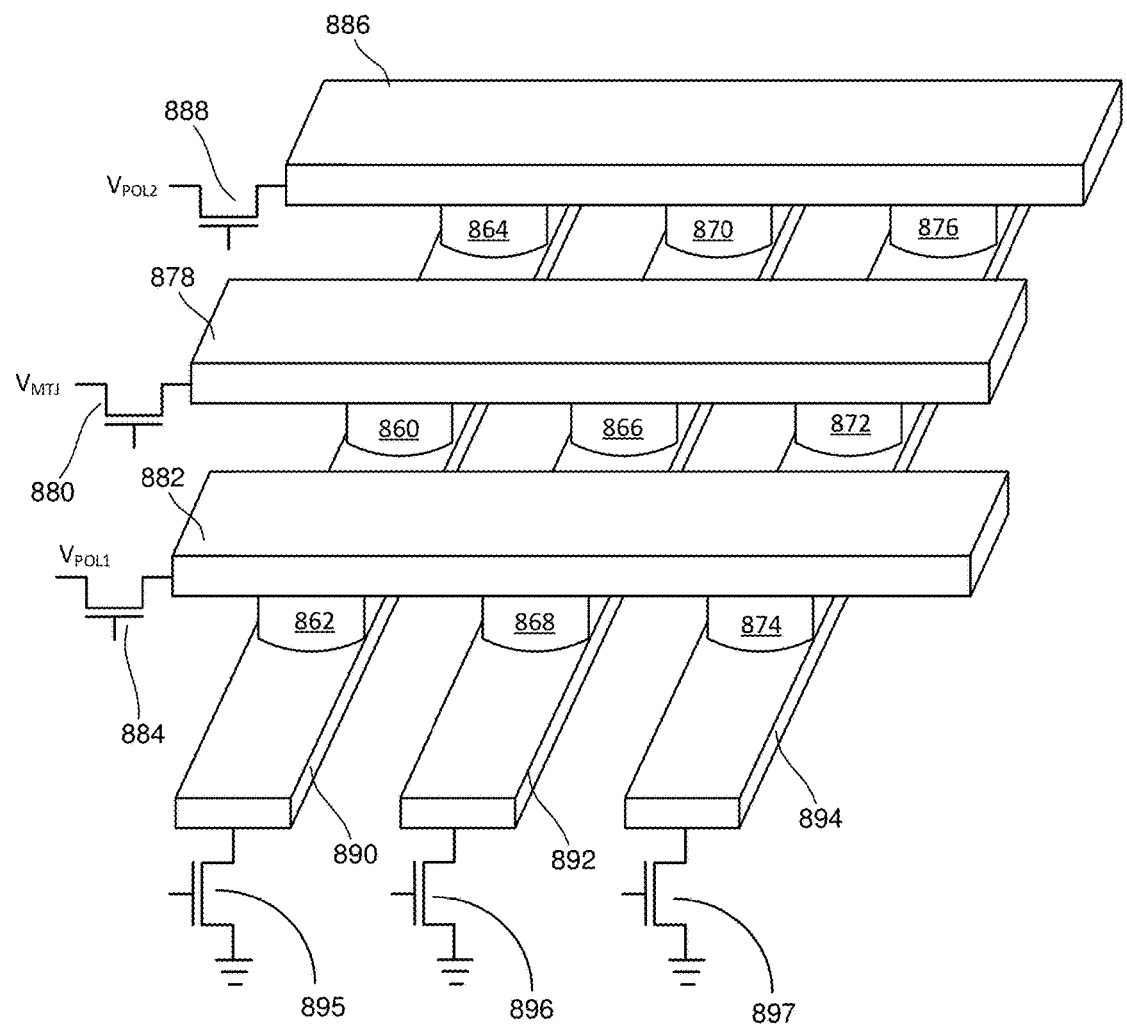
FIG. 11A depicts a portion of a cross point memory array.

FIG. 11A depicts a portion of another embodiment of a cross point memory array in which the MRAM memory cells each include two polarization layers, for example, as per the memory cells of FIGS. 5, 5A, 6 and 7. In one example implementation, each polarization layer is shared between two adjacent memory cells. In FIG. 11A, three memory cells are depicted; however, a full memory array will likely have millions of memory cells. The first memory cell includes MTJ 860, polarization layer 862 and polarization layer 864. The second memory cell includes MTJ 866, polarization layer 868 and polarization layer 870. The third memory cell includes MTJ 872, polarization layer 874 and polarization layer 876. Above and connected to MTJ 860, MTJ 866 and MTJ 872 is MTJ column 878, which is a conductor (i.e. metal line). Transistor 880 (also connected to $V_{MTJ}$) is used to activate/drive MTJ column 878. Above and connected to polarization layer 862, polarization layer 868 and polarization layer 874 is POL1 column 882, which is a conductor (i.e. metal line). Transistor 884 (also connected to $V_{POL1}$) is used to activate/drive POL1 column 882. Above and connected to polarization layer 864, polarization layer 870 and polarization layer 876 is POL2 column 886, which is a conductor (i.e. metal line). Transistor 888 (also connected to $V_{POL2}$) is used to activate/drive POL2 column 886. Below and connected to polarization layer 862, MTJ 860 and polarization layer 864 is row 890, which is an implementation of a spin accumulation layer. Below and connected to polarization layer 868, MTJ 866 and polarization layer 870 is row 892, which is an implementation of a spin accumulation layer. Below and connected to polarization layer 874, MTJ 872 and polarization layer 876 is row 894, which is an implementation of a spin accumulation layer. Transistor 895 is used to activate/drive row 890. Transistor 896 is used to activate/drive row 892. Transistor 897 is used to activate/drive row 894. The structure of FIG. 11 can be replicated many times to form a bigger memory array.

Figure 12:
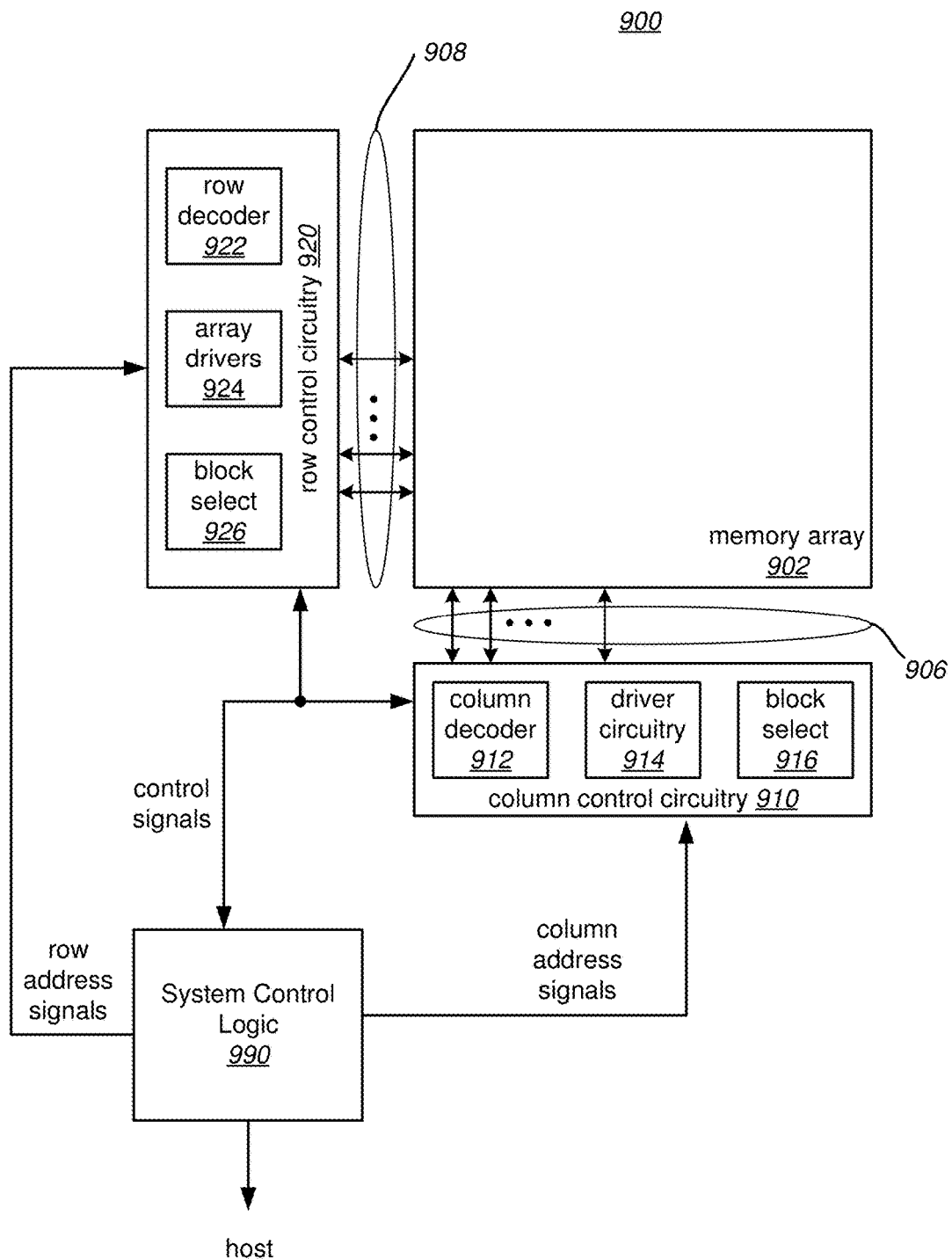
FIG. 12 is a block diagram of a memory system.

FIG. 12 is a block diagram that depicts one example of a memory system 900 that can implement the technology described herein. Memory system 900 includes a memory array 902 that can include any of memory cells described above. The array terminal lines of memory array 902 include the various layer(s) of word lines organized as rows, and the various layer(s) of bit lines organized as columns. However, other orientations can also be implemented. Memory system 900 includes row control circuitry 920, whose outputs 908 are connected to respective word lines of the memory array 902. Row control circuitry 920 receives a group of M row address signals and one or more various control signals from System Control Logic circuit 990, and typically may include such circuits as row decoders 922, array terminal drivers 924, and block select circuitry 926 for both reading and writing operations. Memory system 900 also includes column control circuitry 910 whose input/outputs 906 are connected to respective bit lines of the memory array 902. Column control circuitry 906 receives a group of N column address signals and one or more various control signals from System Control Logic 990, and typically may include such circuits as column decoders 912, array terminal receivers or drivers 914, block select circuitry 916, as well as read/write circuitry, and I/O multiplexers. System control logic 990 receives data and commands from a host and provides output data to the host. In other embodiments, system control logic 990 receives data and commands from a separate controller circuit and provides output data to that controller circuit, with the controller circuit communicating with the host. System control logic 990 may include one or more state machines, registers and other control logic for controlling the operation of memory system 900.

In one embodiment, all of the components depicted in FIG. 12 are arranged on a single integrated circuit. For example, system control logic 990, column control circuitry 910 and row control circuitry 920 are formed on the surface of a substrate and memory array 902 is a monolithic three dimensional memory array formed above the substrate (and, therefore, above system control logic 990, column control circuitry 910 and row control circuitry 920). In some cases, a portion of the control circuitry can be formed on the same layers as some of the memory array.

Integrated circuits incorporating a memory array usually subdivide the array into a number of sub-arrays or blocks. Blocks are contiguous group of memory cells having contiguous word and bit lines generally unbroken by decoders, drivers, sense amplifiers, and input/output circuits.

One embodiment includes an apparatus comprising a magnetic tunnel junction, a spin accumulation layer in electrical contact with the magnetic tunnel junction, and a first polarization layer in electrical contact with the spin accumulation layer. The first polarization layer is separate from the magnetic tunnel junction and separate from the spin accumulation layer.

One embodiment includes an apparatus comprising a first terminal, a fixed ferromagnetic layer connected to the first terminal, a free ferromagnetic layer, a tunnel barrier between the fixed ferromagnetic layer and the free ferromagnetic layer, an intermediate layer in communication with the free ferromagnetic layer and configured to inject spin current into the free layer to change direction of magnetization of the free layer such that the fixed ferromagnetic layer, a second terminal, a third terminal connected to the intermediate layer, and a polarizer connected to the second terminal and the intermediate layer. The tunnel barrier and the free ferromagnetic layer form a non-volatile storage element.

One embodiment includes an apparatus comprising a fixed magnetic layer having a pinned direction of magnetization, a free magnetic layer having changeable direction of magnetization, a tunnel barrier between the fixed ferromagnetic layer and the free ferromagnetic layer and means for switching the direction of magnetization of the free magnetic layer by applying spin accumulation torque to the free magnetic layer.

One embodiment includes an apparatus comprising a cross point array of non-volatile memory cells. The cross point array of non-volatile memory cells comprises a plurality of magnetic tunnel junctions; a plurality of polarization layers; a plurality of rows connected below the plurality of magnetic tunnel junctions and the plurality of polarization layers; a plurality of first columns connected on top of a first subset of the plurality of polarization layers; a plurality of second columns connected on top of the plurality of magnetic tunnel junctions; and a plurality of third columns connected on top of a second subset of the plurality of polarization layers, each column of the first columns and the second columns is shared between adjacent memory cells.

One embodiment includes a method for writing to a MRAM memory cell having a first terminal, a second terminal and a third terminal, the memory cell comprising a magnetic tunnel junction, a spin accumulation layer connected to the magnetic tunnel junction and a first polarization layer connected to the spin accumulation layer, the first terminal is connected to the magnetic tunnel junction, the second terminal is connected to the polarization layer and the third terminal is connected to the spin accumulation layer, the method comprising: applying a write current at the second terminal into the polarization layer; spin polarizing electrons of the write current as they pass through the polarization layer; injecting the spin polarized electrons into the spin accumulation layer; diffusing at least some of the spin polarized electrons from the spin accumulation layer to a free layer of the magnetic tunnel junction; the spin polarized electrons imparting a torque on the free layer; and the torque causing spin orientation in the free layer to change to be same as a pinned layer of the magnetic tunnel junction.

In one embodiment, the method further includes: applying a voltage across the second terminal and the third terminal to cause current in opposite direction to the write current; forcing electrons from the spin accumulation layer toward the polarization layer; forcing into the polarization layer electrons with a spin associated with the same direction of magnetization of polarization layer; forcing to the junction between spin accumulation layer and polarization layer electrons with a spin associated with direction opposite the direction of magnetization of polarization layer such that some of the electrons pass through the junction between spin accumulation layer and polarization layer to diffuse into the polarization layer and some of the electrons get reflected back into spin accumulation layer; injecting into the free layer electrons reflected back into spin accumulation layer; and electrons injected into the free layer imparting a torque on the free layer causing the spin orientation in the free layer to change to be opposite that of polarization layer, thus the direction of magnetization in free layer becomes anti-parallel to the direction of magnetization of pinner layer.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a magnetic tunnel junction that includes a free ferromagnetic layer having a direction of magnetization that can be switched;
   a spin accumulation layer in electrical contact with the magnetic tunnel junction; and
   a first polarization layer in electrical contact with the spin accumulation layer, the first polarization layer is separate from the magnetic tunnel junction and separate from the spin accumulation layer, the first polarization layer has a fixed direction of magnetization that is collinear with a direction of magnetization of the free ferromagnetic layer.

2. The apparatus of claim 1, further comprising:
   a first terminal connected to the magnetic tunnel junction;
   a second terminal connected to the first polarization layer; and
   a third terminal connected to the spin accumulation layer.

3. The apparatus of claim 2, wherein:
   the magnetic tunnel junction is configured to exhibit a programmable resistance in response to a read bias through the magnetic tunnel junction from the first terminal to the third terminal.

4. The apparatus of claim 2, wherein:
   the magnetic tunnel junction is configured to change resistance in response to a write current applied from the second terminal to the third terminal.

5. The apparatus of claim 2, wherein:
   the magnetic tunnel junction further comprises a pinned ferromagnetic layer and a tunnel barrier between the pinned ferromagnetic layer and the free ferromagnetic layer; and
   the magnetic tunnel junction is configured to change resistance in response to a write current applied from the second terminal to the third terminal that creates spin accumulation of polarized spins in the spin accumulation layer, the polarized spins exert spin torque on the free ferromagnetic layer via spin diffusion.

6. The apparatus of claim 1, wherein:
   the spin accumulation layer includes a highly conductive metal.

7. The apparatus of claim 1, wherein:
   the magnetic tunnel junction further comprises a fixed ferromagnetic layer having a fixes direction of magnetization and a tunnel barrier between the fixed ferromagnetic layer and the free ferromagnetic layer; and
   the first polarization layer and the spin accumulation layer configured to inject spin current into the free ferromagnetic layer to change direction of magnetization of the free layer without an electrical current running through the tunnel barrier.

8. The apparatus of claim 1, wherein:
   the first polarization layer is a high spin polarized ferromagnetic layer.

9. The apparatus of claim 1, wherein the magnetic tunnel junction comprises:
   a fixed ferromagnetic layer; and
   a tunnel barrier between the fixed ferromagnetic layer and the free ferromagnetic layer.

10. The apparatus of claim 1, wherein the magnetic tunnel junction comprises:
    a pinned ferromagnetic layer having fixed direction of magnetization;
    a reference ferromagnetic layer having fixed direction of magnetization;
    an anti-ferromagnetic inter-layer coupling positioned between the pinned ferromagnetic layer and the reference ferromagnetic layer; and
    a tunnel barrier between the free ferromagnetic layer and the reference ferromagnetic layer.

11. The apparatus of claim 1, wherein:
    magnetization in the magnetic tunnel junction is in-plane.

12. The apparatus of claim 1, wherein:
    magnetization in the magnetic tunnel junction is perpendicular to a plane of the magnetic tunnel junction.

13. The apparatus of claim 1, further comprising:
    a cross point array comprising a plurality of rows connected below a plurality of magnetic tunnel junctions and a plurality of polarization layers, a plurality of first columns connected on top of the plurality of polarization layers and a plurality of second columns connected on top of the plurality of magnetic tunnel junctions.

14. The apparatus of claim 1, further comprising:
    a first terminal connected to the magnetic tunnel junction;

a second terminal connected to the first polarization layer; and a third terminal connected to the spin accumulation layer at a first end of the spin accumulation layer, the magnetic tunnel junction is positioned at the spin accumulation layer between the first polarization layer and the third terminal.

15. The apparatus of claim 1, further comprising:

a first terminal connected to the magnetic tunnel junction; and a second terminal connected to the first polarization layer, the magnetic tunnel junction is configured to exhibit a programmable resistance that is detectable in response to a read bias through the magnetic tunnel junction from the first terminal to the second terminal, the magnetic tunnel junction is configured to change resistance in response to a write current applied from the first terminal to the second terminal that creates spin accumulation of polarized spins in the spin accumulation layer, the polarized spins exert spin torque on the magnetic tunnel junction via spin diffusion.

16. An apparatus, comprising:

a first terminal;

a fixed ferromagnetic layer connected to the first terminal;

a free ferromagnetic layer;

a tunnel barrier between the fixed ferromagnetic layer and the free ferromagnetic layer such that the fixed ferromagnetic layer, the tunnel barrier and the free ferromagnetic layer form a non-volatile storage element;

an intermediate layer in communication with the free ferromagnetic layer and configured to inject spin current into the free ferromagnetic layer to change direction of magnetization of the free layer without an electrical current running through the tunnel barrier;

a second terminal;

a third terminal connected to the intermediate layer; and a polarizer connected to the second terminal and the intermediate layer.

17. An apparatus according to claim 16, wherein:

the free ferromagnetic layer is configured to change resistance in response to a write current applied from the second terminal to the third terminal that creates spin accumulation of polarized spins in the intermediate layer, the polarized spins exert spin torque on the free ferromagnetic layer via spin diffusion.

18. An apparatus, comprising:

a fixed magnetic layer having a pinned direction of magnetization;

a free magnetic layer having changeable direction of magnetization;

a tunnel barrier between the fixed ferromagnetic layer and the free ferromagnetic layer; and means for switching the direction of magnetization of the free magnetic layer by applying spin accumulation torque to the free magnetic layer, the means for switching includes a polarizer having a direction of magnetization that is collinear with the changeable direction of magnetization of the free magnetic layer.

* * * * *